United States Patent [19]

Matsuno

[11] Patent Number: 5,313,115
[45] Date of Patent: May 17, 1994

[54] COMPARATOR

[75] Inventor: Yasushi Matsuno, Atsugi, Japan

[73] Assignee: Canon Kabushiki Kaisha, Tokyo, Japan

[21] Appl. No.: 793,521

[22] Filed: Nov. 18, 1991

[30] Foreign Application Priority Data

Nov. 19, 1990 [JP] Japan .................. 2-311278

[51] Int. Cl.⁵ .................. H03K 5/24; H03K 5/153
[52] U.S. Cl. .................. 307/362; 307/491; 307/494
[58] Field of Search .................. 307/350, 362, 272.3, 307/360, 296.4, 442, 491, 494

[56] References Cited

U.S. PATENT DOCUMENTS

| T957,008 | 4/1877 | Sheng | 307/252 |
| 3,942,044 | 3/1976 | Armstrong | 307/362 |
| 4,009,398 | 2/1977 | Yamada et al. | 307/228 |
| 4,716,305 | 12/1987 | Sakuragi et al. | 307/296 |
| 4,748,352 | 5/1988 | Kamiya et al. | 307/296.4 |
| 4,871,926 | 10/1989 | Neely et al. | 307/296.4 |
| 5,045,943 | 9/1991 | Kurihara | 358/153 |

FOREIGN PATENT DOCUMENTS 2062996  5/1981  United Kingdom .

OTHER PUBLICATIONS

"Audio AGC circuit has 40-dB dynamic range" by Norman M. Hill, Electrical Design News Jul. 23, 1987 No. 15, Newton, Mass., USA pp. 309-310.

Primary Examiner—John Zazworsky
Attorney, Agent, or Firm—Fitzpatrick, Cella, Harper & Scinto

[57] ABSTRACT

A comparator comprises transistors to turn on/off an input terminal and a control circuit to enable the transistors in a high impedance input state. The high impedance input state can be detected by the above construction without additionally providing any wire and connector.

2 Claims, 1 Drawing Sheet

COMPARATOR

BACKGROUND OF THE INVENTION

1. Field of the Invention

The invention relates to a comparator.

2. Related Background Art

FIG. 3 shows an example of a circuit of a conventional comparator. $V_3$ denotes a reference voltage source; $I_7$ indicates a constant current source; $Q_{21}$ to $Q_{25}$ transistors; and $R_1$ and $R_2$ resistors.

A circuit which is constructed by the constant current source $I_7$ and the transistors $Q_{21}$ to $Q_{24}$ is a simple comparator. An input terminal IN and the resistor $R_2$ are connected to a base of the transistor $Q_{21}$ and a base of the transistor $Q_{25}$ through wires and connectors from another electronic circuit board, respectively.

The operation of the comparator of FIG. 3 will now be described hereinbelow.

In the case where the input terminal IN and the resistor $R_2$ are respectively connected to the above transistors $Q_{21}$ and $Q_{25}$, the transistor $Q_{25}$ is turned off and the circuit operates as an ordinary comparator.

When the terminal IN and the resistor $R_2$ are not connected, an output of the comparator is an output in a state in which a high level signal has been applied to an input. In this state, if a problem logically occurs, the transistor $Q_{25}$ connected by the resistor $R_1$ is set into a saturation state by a power source $V_{cc}$, thereby fixing a base potential of the transistor $Q_{21}$ to a low level and satisfying the logic.

The conventional comparator, however, has the following technical problems to be solved.

(1) Since the wires or connectors must be added to know the coupling state, the costs rise.

(2) Since the wires or connectors are needed to know the coupling state in addition to a purpose of the input of the comparator, it is impossible to know the coupling states of both of them. Then a disconnection to each wire or a damage of the connector occurs, the normal operation cannot be performed and there is a fear of malfunction.

SUMMARY OF THE INVENTION

It is an object of the invention to provide a comparator which can solve the foregoing problems.

Another object of the invention is to provide a comparator comprising transistors to control the state of an input terminal and a control circuit to enable the transistors in a high impedance input state.

According to the invention, the high impedance input state can be detected by the above construction without additionally providing any wire and connector.

DETAILED DESCRIPTION OF THE PREFERRED EMBODIMENTS

Figure 1:
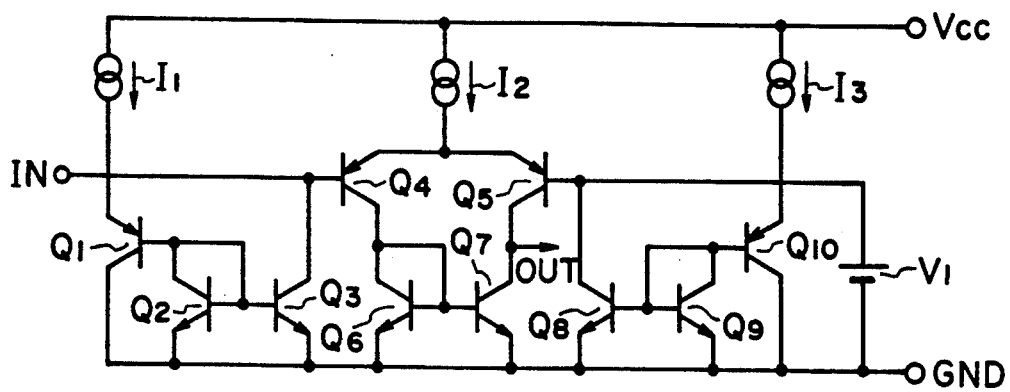
FIG. 1 is a circuit diagram of a comparator according to an embodiment of the invention.

FIG. 1 is a circuit constructional diagram showing most preferably a feature of the invention. In FIG. 1, $V_1$ denotes a reference voltage source; $I_1$ to $I_3$ indicate constant current sources; and $Q_1$ to $Q_{10}$ indicate transistors.

A circuit which is constructed by the constant current source $I_2$ and the transistors $Q_4$ to $Q_7$ is a comparator. Current mirror circuits are constructed by the transistors $Q_2$ and $Q_3$ and the transistors $Q_8$ and $Q_9$. The constant current source $I_1$ and the transistor $Q_1$ supply a constant current to the current mirror circuit. The constant current source $I_3$ and the transistor $Q_{10}$ supply a constant current to the current mirror circuit.

It is now assumed that the transistors $Q_1$, $Q_4$, $Q_5$, and $Q_{10}$ are equal PNP transistors and that the transistors $Q_2$, $Q_3$, $Q_8$, and $Q_9$ are equal NPN transistors. There are the relations of $I_1 = I_3$ and $I_1 > I_2$ among the constant current sources $I_1$ to $I_3$.

The operation of the comparator of FIG. 1 will now be described hereinbelow.

In the case where some input exists at the input terminal IN which is connected to a base of the transistor $Q_4$, a collector of the transistor $Q_3$ current of the transistor $Q_1$ from the base of the transistor $Q_4$ and the terminal IN. At this time, the circuit operates as an ordinary comparator.

The operation in a disconnected state of the input terminal IN, which is a problem in the conventional comparator, in the case of the embodiment will now be described. When no input exists at the input terminal IN, the collector of the transistor $Q_3$ tries to pull in all of the currents which are equivalent to the base current of the transistor $Q_1$ from the base of the transistor $Q_4$. Since the relation between the constant current sources $I_1$ and $I_2$ is now set to $I_1 > I_2$, the base current of the transistor $Q_1$ should equal the collector current of the transistor $Q_3$ according to the well known operation of current mirror circuitry. But the collector current of the transistor $Q_3$ cannot be greater than the base current of the transistor $Q_4$. Since transistor $Q_3$ cannot pull in sufficient current from base of $Q_4$ to equal the base current of transistor $Q_1$, the transistor $Q_3$ is set into the saturating state. A base potential of the transistor $Q_4$, therefore, is determined by a voltage between the collector and the emitter of the transistor $Q_3$ and is fixed to a low level.

Figure 2:
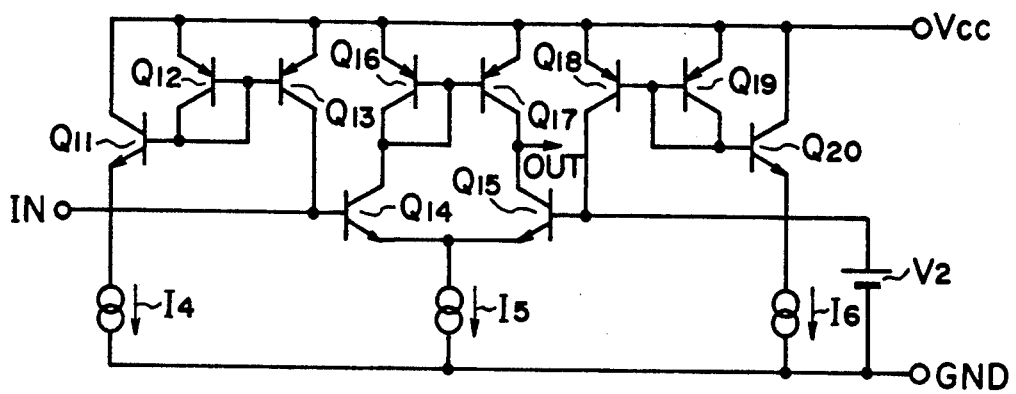
FIG. 2 is a circuit diagram of a comparator according to another embodiment of the invention.
Figure 3:
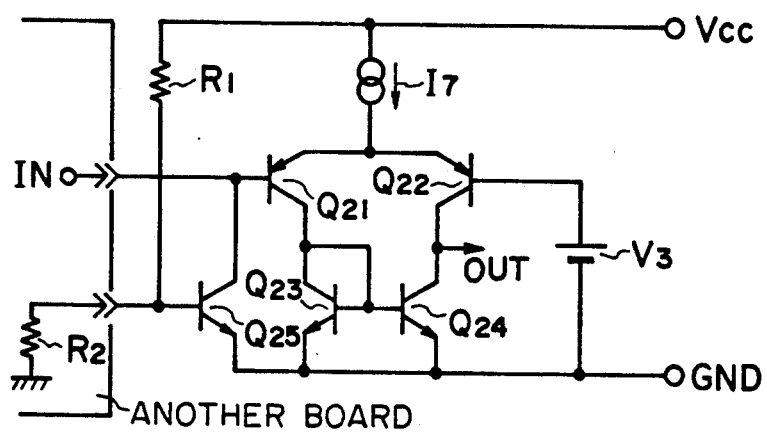
FIG. 3 is a circuit diagram of a conventional comparator.

FIG. 2 is a circuit constructional diagram showing another embodiment of the invention. In FIG. 2, $V_2$ denotes a reference voltage source; $I_4$ to $I_6$ constant current sources; and $Q_{11}$ to $Q_{20}$ transistors.

A circuit which is constructed by the constant current source $I_5$ and the transistors $Q_{14}$ to $Q_{17}$ is a comparator. Current mirror circuits are constructed by the transistors $Q_{12}$ and $Q_{13}$ and the transistors $Q_{18}$ and $Q_{19}$. The constant current source $I_4$ and the transistor $Q_{11}$ function as a constant current source which is supplied to the current mirror circuit. The constant current source $I_6$ and the transistor $Q_{20}$ function as a constant current source which is supplied to the current mirror circuit.

It is now assumed that the transistors $Q_{11}$, $Q_{14}$, $Q_{15}$, and $Q_{20}$ are equal NPN transistors and that the transistors $Q_{12}$, $Q_{13}$, $Q_{18}$, and $Q_{19}$ are equal PNP transistors. There are the relations of $I_4 = I_6$ and $I_4 > I_5$ among the constant current sources $I_4$ to $I_6$.

The operation of the comparator of FIG. 2 will now be described hereinbelow.

In the case where some input exists at the input terminal IN which is connected to a base of the transistor $Q_{14}$, a collector of the transistor $Q_{13}$ supplies a current which is equivalent to a base current of the transistor $Q_{11}$ to the base of the transistor $Q_{14}$ and the terminal IN. At this time, the circuit operates as an ordinary comparator.

In the case where no input exists at the input terminal IN, which becomes a problem in the conventional comparator, the collector of the transistor $Q_{13}$ tries to supply all of the currents equivalent of the base current of the transistor $Q_{11}$ to the base of the transistor $Q_{14}$. Since the relation between the constant current sources $I_4$ and $I_5$ is set to $I_4 > I_5$, the base current of the transistor $Q_{11}$ should equal the collector current of the transistor $Q_{13}$ according to the well known operation of current mirror circuitry. But the collector current of the transistor $Q_{13}$ cannot be greater than the base current of the transistor $Q_{14}$. Since transistor $Q_{13}$ cannot supply sufficient current to the base of $Q_{14}$ to equal the base current of transistor $Q_{11}$, the transistor $Q_{13}$ is set into the saturating state. Therefore, the base potential of the transistor $Q_{14}$ is determined by the voltage between the collector and the emitter of the transistor $Q_{13}$ and is fixed to a high level.

As described above, according to the embodiments, since none of the wires and connectors is additionally needed, the input disconnection state can be certainly known without increasing the costs.

What is claimed is:
1. A comparator comprising:
a pair of transistors ($Q_4$, $Q_5$) connected to an input terminal (IN) to which an input signal is supplied and to an output terminal (OUT) for supplying an output signal, a base of one of the pair of transistors being connected to the input terminal, and a collector of the other of the pair of transistors being connected to the output terminal;
a control circuit ($Q_1$, $Q_2$, $Q_3$, $I_1$) connected to the input terminal for controlling a potential of the input terminal responsive to a high impedance condition of the input terminal; and
a circuit ($Q_8$, $Q_9$, $Q_{10}$, $I_3$) being identical with said control circuit, and being connected to one ($Q_5$) of the pair of the transistors connected to said output terminal.

2. A comparator according to claim 1, wherein said control circuit includes a first transistor ($Q_3$) connected to the input terminal, a second transistor ($Q_2$) constituting a current mirror circuit together with the first transistor ($Q_3$), and a current source ($I_1$) and a third transistor ($Q_1$) for supplying a current to the current mirror circuit.

* * * * *

UNITED STATES PATENT AND TRADEMARK OFFICE
CERTIFICATE OF CORRECTION

PATENT NO. : 5,313,115
DATED : May 17, 1994
INVENTOR(S) : YASUSHI MATSUNO

It is certified that error appears in the above-indentified patent and that said Letters Patent is hereby corrected as shown below:

TITLE PAGE

AT [56] REFERENCES CITED

U.S. Patent Documents,
"T957,008  4/1877  Sheng" should read
--T957,008  4/1977  Sheng--.

COLUMN 3

Line 7, "equivalent of" should read --equivalent to--.

Signed and Sealed this

Fifteenth Day of November, 1994

Attest:

BRUCE LEHMAN

Attesting Officer

Commissioner of Patents and Trademarks